US007512245B2

(12) United States Patent
Rasmussen et al.

(10) Patent No.: US 7,512,245 B2

(45) Date of Patent: Mar. 31, 2009

(54) METHOD FOR DETECTION OF OWN VOICE ACTIVITY IN A COMMUNICATION DEVICE

(75) Inventors: Karsten Bo Rasmussen, Hellerup (DK); Søren Laugesen, Hellerup (DK)

(73) Assignee: Oticon A/S, Hellerup (DK)

( * ) Notice: Subject to any disclaimer, the term of this patent is extended or adjusted under 35 U.S.C. 154(b) by 141 days.

(21) Appl. No.: 10/546,919

(22) PCT Filed: Feb. 4, 2004

(86) PCT No.: PCT/DK2004/000077

§ 371 (c)(1),
(2), (4) Date: May 12, 2006

(87) PCT Pub. No.: WO2004/077090

PCT Pub. Date: Sep. 10, 2004

(65) Prior Publication Data

US 2006/0262944 A1 Nov. 23, 2006

(30) Foreign Application Priority Data

Feb. 25, 2003 (DK) ............................... 2003 00288

(51) Int. Cl.
*H03G 3/20* (2006.01)
*H03G 3/00* (2006.01)
*H04R 3/00* (2006.01)

(52) U.S. Cl. .......................... 381/110; 381/122; 381/91

(58) Field of Classification Search ......... 381/312–331, 381/91, 92, 122, 95, 56, 110; 704/272
See application file for complete search history.

(56) References Cited

U.S. PATENT DOCUMENTS 5,448,637 A * 9/1995 Yamaguchi et al. ......... 379/430
5,539,859 A 7/1996 Robbe et al.

(Continued)

FOREIGN PATENT DOCUMENTS

DE 41 26 902 A1 2/1992

(Continued)

OTHER PUBLICATIONS

Nordholm et al., “Chebyshev Optimization for the Design of Broadband Beamformers In the Near Field”, IEEE transaction on Circuits and Systemts-II: Analog and Digital Signal Processing, vol. 45, No. 1, Jan. 1998.*

(Continued)

*Primary Examiner*—Xu Mei
(74) *Attorney, Agent, or Firm*—Birch, Stewart, Kolasch & Birch, LLP

(57) ABSTRACT

In the method according to the invention a signal processing unit receives signals from at least two microphones worn on the user’s head, which are processed so as to distinguish as well as possible between the sound from the user’s mouth and sounds originating from other sources. The distinction is based on the specific characteristics of the sound field produced by own voice, e.g. near-field effects (proximity, reactive intensity) or the symmetry of the mouth with respect to the user’s head.

15 Claims, 2 Drawing Sheets

U.S. PATENT DOCUMENTS

| | | | | |
|---|---|---|---|---|
| 5,835,607 | A * | 11/1998 | Martin et al. | 381/94.1 |
| 6,246,773 | B1 * | 6/2001 | Eastty | 381/71.11 |
| 6,424,721 | B1 | 7/2002 | Hohn | |
| 6,574,592 | B1 * | 6/2003 | Nankawa et al. | 704/206 |
| 6,728,385 | B2 * | 4/2004 | Kvaløy et al. | 381/328 |
| 7,340,231 | B2 * | 3/2008 | Behrens et al. | 455/173.1 |
| 2001/0019516 | A1 | 9/2001 | Wake et al. | |
| 2002/0041695 | A1 * | 4/2002 | Luo | 381/313 |
| 2003/0027600 | A1 | 2/2003 | Krasny et al. | |
| 2008/0189107 | A1 * | 8/2008 | Laugesen | 704/233 |

FOREIGN PATENT DOCUMENTS

| | | | |
|---|---|---|---|
| EP | 0 386 765 | B1 | 9/1990 |
| EP | 1251714 | A2 | 10/2002 |
| EP | 1251714 | A3 | 8/2004 |
| WO | WO-00/01200 | A1 | 1/2000 |
| WO | WO-01/35118 | A1 | 5/2001 |
| WO | WO-02/17835 | A1 | 3/2002 |
| WO | WO-02/098169 | A1 | 12/2002 |
| WO | WO-03/032681 | A1 | 4/2003 |
| WO | WO-2004/077090 | A1 | 9/2004 |

OTHER PUBLICATIONS

Laugesen, 2003 IEEE Workshop on Applications of Signal Procesing to Audio and Acoustics, Oct. 19-22, 2003, pp. 37-40.

Nordholm et al., IEEE Transactions on Circuits and Systems II: Analog and Digital Signal Processing, vol. 45, No. 1, Jan. 1998, pp. 141-143.

Sullivan, Ph. D Thesis, Carnegie Melon University, Aug. 1996, Pennsylvania.

Ryan et al., IEEE Transactions on Speech and Audio Processing, vol. 8, No. 2, Mar. 2000, pp. 173-176.

Knapp et al., IEEE Transactions on Acoustics, Speech and Signal Processing, vol. ASSP-24, No. 4, Aug. 1976, pp. 320-327.

* cited by examiner

METHOD FOR DETECTION OF OWN VOICE ACTIVITY IN A COMMUNICATION DEVICE

AREA OF THE INVENTION

The invention concerns a method for detection of own voice activity to be used in connection with a communication device. According to the method at least two microphones are worn at the head and a signal processing unit is provided, which processes the signals so as to detect own voice activity.

The usefulness of own voice detection and the prior art in this field is described in DK patent application PA 2001 01461, from which PCT application WO 2003/032681 claims priority. This document also describes a number of different methods for detection of own voice.

However, it has not been proposed to base the detection of own voice on the sound field characteristics that arise from the fact that the mouth is located symmetrically with respect to the user's head. Neither has it been proposed to base the detection of own voice on a combination of a number individual detectors, each of which are error-prone, whereas the combined detector is robust.

BACKGROUND OF THE INVENTION

From DK PA 2001 01461 the use of own voice detection is known, as well as a number of methods for detecting own voice. These are either based on quantities that can be derived from a single microphone signal measured e.g. at one ear of the user, that is, overall level, pitch, spectral shape, spectral comparison of auto-correlation and auto-correlation of predictor coefficients, cepstral coefficients, prosodic features, modulation metrics; or based on input from a special transducer, which picks up vibrations in the ear canal caused by vocal activity. While the latter method of own voice detection is expected to be very reliable it requires a special transducer as described, which is expected to be difficult to realise. In contradiction, the former methods are readily implemented, but it has not been demonstrated or even theoretically substantiated that these methods will perform reliable own voice detection.

From U.S. publication No.: US 2003/0027600 a microphone antenna array using voice activity detection is known. The document describes a noise reducing audio receiving system, which comprises a microphone array with a plurality of microphone elements for receiving an audio signal. An array filter is connected to the microphone array for filtering noise in accordance with select filter coefficients to develop an estimate of a speech signal. A voice activity detector is employed, but no considerations concerning far-field contra near-field are employed in the determination of voice activity.

From WO 02/098169 a method is known for detecting voiced and unvoiced speech using both acoustic and non-acoustic sensors. The detection is based upon amplitude differences between microphone signals due to the presence of a source close to the microphones.

The object of this invention is to provide a method, which performs reliable own voice detection, which is mainly based on the characteristics of the sound field produced by the user's own voice. Furthermore the invention regards obtaining reliable own voice detection by combining several individual detection schemes. The method for detection of own vice can advantageously be used in hearing aids, head sets or similar communication devices.

SUMMARY OF THE INVENTION

The invention provides a method for detection of own voice activity in a communication device wherein one or both of the following set of actions are performed, A: providing at least two microphones at an ear of a person, receiving sound signals by the microphones and routing the signals to a signal processing unit wherein the following processing of the signal takes place: the characteristics, which are due to the fact that the microphones are in the acoustical near-field of the speaker's mouth and in the far-field of the other sources of sound are determined, and based on this characteristic it is assessed whether the sound signals originates from the users own voice or originates from another source, B: providing at least a microphone at each ear of a person and receiving sound signals by the microphones and routing the microphone signals to a signal processing unit wherein the following processing of the signals takes place: the characteristics, which are due to the fact that the user's mouth is placed symmetrically with respect to the user's head are determined, and based on this characteristic it is assessed whether the sound signals originates from the users own voice or originates from another source.

The microphones may be either omni-directional or directional. According to the suggested method the signal processing unit in this way will act on the microphone signals so as to distinguish as well as possible between the sound from the user's mouth and sounds originating from other sources.

In a further embodiment of the method the overall signal level in the microphone signals is determined in the signal processing unit, and this characteristic is used in the assessment of whether the signal is from the users own voice. In this way knowledge of normal level of speech sounds is utilized. The usual level of the users voice is recorded, and if the signal level in a situation is much higher or much lower it is than taken as an indication that the signal is not coming from the users own voice.

According to an embodiment of the method, the characteristics, which are due to the fact that the microphones are in the acoustical near-field of the speaker's mouth are determined by a filtering process in the form of FIR filters, the filter coefficients of which are determined so as to maximize the difference in sensitivity towards sound coming from the mouth as opposed to sound coming from all directions by using a Mouth-to-Random-far-field index (abbreviated M2R) whereby the M2R obtained using only one microphone in each communication device is compared with the M2R using more than one microphone in each hearing aid in order to take into account the different source strengths pertaining to the different acoustic sources. This method takes advantage of the acoustic near field close to the mouth.

In a further embodiment of the method the characteristics, which are due to the fact that the user's mouth is placed symmetrically with respect to the user's head are determined by receiving the signals $x_1(n)$ and $x_2(n)$, from microphones positioned at each ear of the user, and compute the cross-correlation function between the two signals: $R_{x_1x_2}(k)=E\{x_1(n)x_2(n-k)\}$, applying a detection criterion to the output $R_{x_1x_2}(k)$, such that if the maximum value of $R_{x_1x_2}(k)$ is found at k=0 the dominating sound source is in the median plane of the user's head whereas if the maximum value of $R_{x_1x_2}(k)$ is found elsewhere the dominating sound source is away from the median plane of the user's head. The proposed embodiment utilizes the similarities of the signals received by the hearing aid microphones on the two sides of the head when the sound source is the users own voice.

The combined detector then detects own voice as being active when each of the individual characteristics of the signal are in respective ranges.

DESCRIPTION OF PREFERRED EMBODIMENTS

Figure 1:
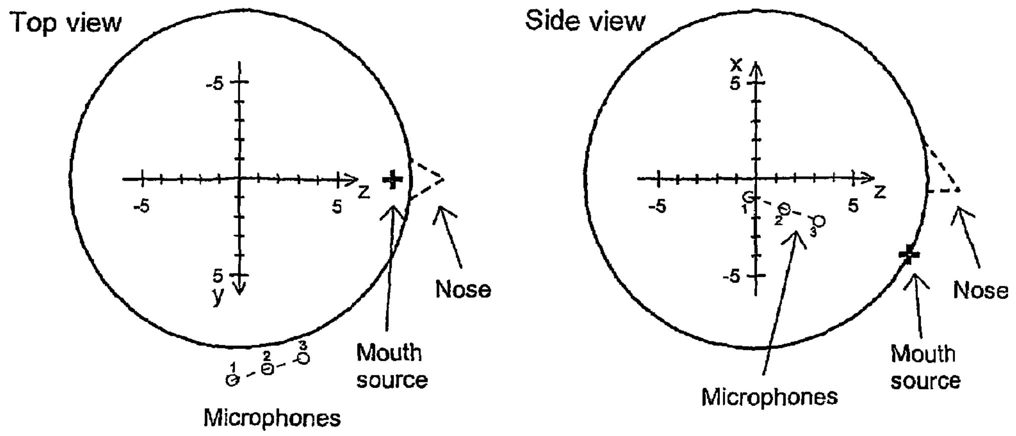
FIG. 1 is a schematic representation of a set of microphones of an own voice detection device according to the invention.
Figure 2:
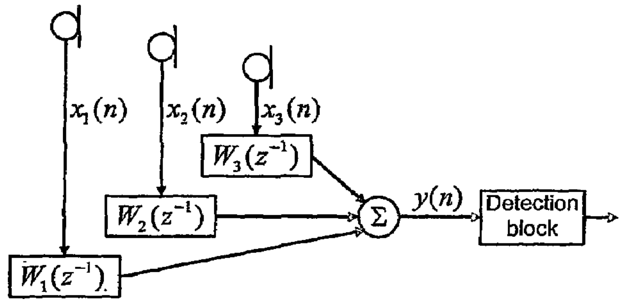
FIG. 2 is a schematic representation of the signal processing structure to be used with the microphones of an own voice detection device according to the invention.

FIG. 1 shows an arrangement of three microphones positioned at the right-hand ear of a head, which is modelled as a sphere. The nose indicated in FIG. 1 is not part of the model but is useful for orientation. FIG. 2 shows the signal processing structure to be used with the three microphones in order to implement the own voice detector. Each microphone signal as digitised and sent through a digital filter ($W_1$, $W_2$, $W_3$), which may be a FIR filter with L coefficients. In that case, the summed output signal in FIG. 2 can be expressed as $$y(n) = \sum_{m=1}^{M} \sum_{l=0}^{L-1} w_{ml} x_m(n-l) = \underline{w}^T \underline{x},$$

where the vector notation $$\underline{w}=[w_{10} \ldots w_{ML-1}]^T, \ \underline{x}=[x_1(n) \ldots x_M(n-L+1)]^T$$

has been introduced. Here M denotes the number of microphones (presently M=3) and $w_{ml}$ denotes the l th coefficient of the m th FIR filter. The filter coefficients in $\underline{w}$ should be determined so as to distinguish as well as possible between the sound from the user's mouth and sounds originating from other sources. Quantitatively, this is accomplished by means of a metric denoted ΔM2R, which is established as follows. First, Mouth-to-Random-far-field index (abbreviated M2R) is introduced. This quantity may be written as $$M2R(f) = 10\log_{10}\left(\frac{|Y_{Mo}(f)|^2}{|Y_{Rff}(f)|^2}\right),$$

where $Y_{Mo}(f)$ is the spectrum of the output signal y(n) due to the mouth alone, $Y_{Rff}(f)$ is the spectrum of the output signal y(n) averaged across a representative set of far-field sources and f denotes frequency. Note that the M2R is a function of frequency and is given in dB. The M2R has an undesirable dependency on the source strengths of both the far-field and mouth sources. In order to remove this dependency a reference $M2R_{ref}$ is introduced, which is the M2R found with the front microphone alone. Thus the actual metric becomes $$\Delta M2R(f)=M2R(f)-M2R_{ref}(f).$$

Figure 3:
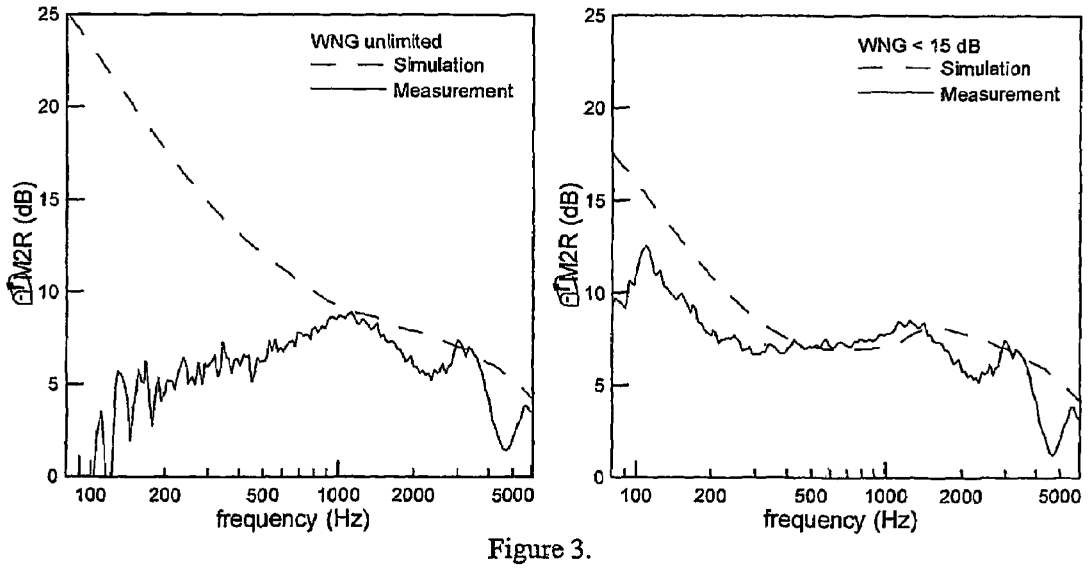
FIG. 3 shows in two conditions illustrations of metric suitable for an own voice detection device according to the invention.

Note that the ratio is calculated as a subtraction since all quantities are in dB, and that it is assumed that the two component M2R functions are determined with the same set of far-field and mouth sources. Each of the spectra of the output signal y(n), which goes into the calculation of ΔM2R, can be expressed as $$Y(f) = \sum_{m=1}^{M} W_m(f) Z_{Sm}(f) q_S(f),$$

where $W_m(f)$ is the frequency response of the m th FIR filter, $Z_{Sm}(f)$ is the transfer impedance from the sound source in question to the m th microphone and $q_s(f)$ is the source strength. Thus, the determination of the filter coefficients $\underline{w}$ can be formulated as the optimisation problem $$\max_{\underline{w}} |\Delta M2R|,$$

where |·| indicates an average across frequency. The determination of $\underline{w}$ and the computation of ΔM2R has been carried out in a simulation, where the required transfer impedances corresponding to FIG. 1 have been calculated according to a spherical head model. Furthermore, the same set of filters have been evaluated on a set of transfer impedances measured on a Brüel & Kjær HATS manikin equipped with a prototype set of microphones. Both set of results are shown in the left-hand side of FIG. 3. In this figure a ΔM2R -value of 0 dB would indicate that distinction between sound from the mouth and sound from other far-field sources was impossible, whereas positive values of ΔM2R indicates possibility for distinction. Thus, the simulated result in FIG. 3 (left) is very encouraging. However, the result found with measured transfer impedances is far below the simulated result at low frequencies. This is because the optimisation problem so far has disregarded the issue of robustness. Hence, robustness is now taken into account in terms of the White Noise Gain of the digital filters, which is computed as $$WNG(f) = 10\log_{10}\left(\sum_{m=1}^{M} |W_m(e^{-j2\pi f/f_S})|^2\right),$$

where $f_s$ is the sampling frequency. By limiting WNG to be within 15 dB the simulated performance is somewhat reduced, but much improved agreement is obtained between simulation and results from measurements, as is seen from the right-hand side of FIG. 3. The final stage of the preferred embodiment regards the application of a detection criterion to the output signal y(n), which takes place in the Detection block shown in FIG. 2. Alternatives to the above ΔM2R-metric are obvious, e.g. metrics based on estimated components of active and reactive sound intensity.

Figure 4:
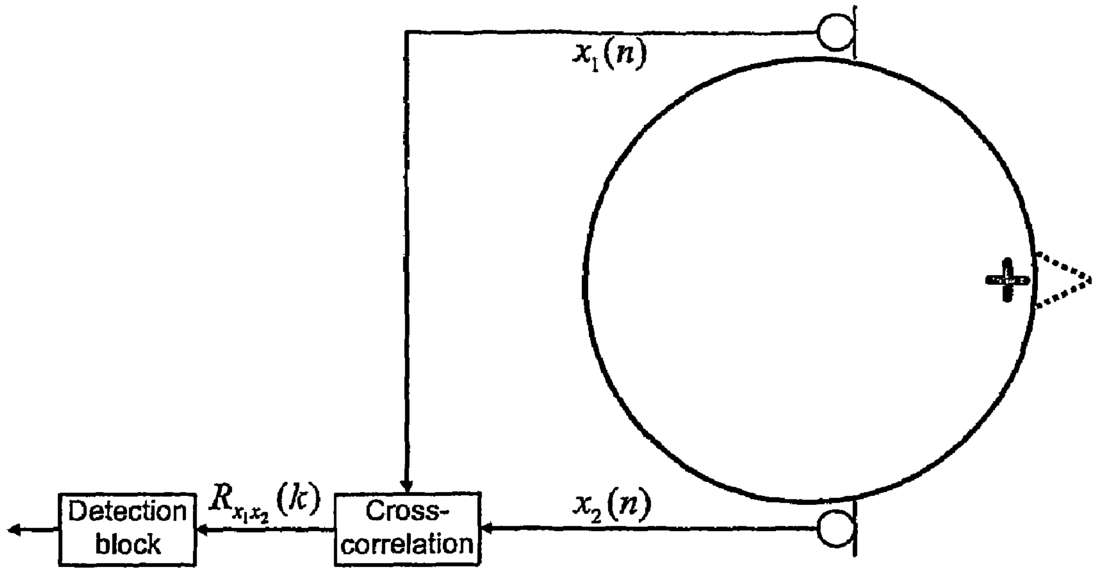
FIG. 4 is a schematic representation of an embodiment of an own voice detection device according to the invention.

Considering an own voice detection device according to the invention, FIG. 4 shows an arrangement of two microphones, positioned at each ear of the user, and a signal processing structure which computes the cross-correlation function between the two signals $x_1(n)$ and $x_2(n)$, that is, $$R_{x_1x_2}(k)=E\{x_1(n)x_2(n-k)\}.$$

As above, the final stage regards the application of a detection criterion to the output $R_{x_1x_2}(k)$, which takes place in the Detection block shown in FIG. 4. Basically, if the maximum value of $R_{x_1x_2}(k)$ is found at k=0 the dominating sound source is in the median plane of the user's head and may thus be own voice, whereas if the maximum value of $R_{x_1x_2}(k)$ is found elsewhere the dominating sound source is away from the median plane of the user's head and cannot be own voice.

Figure 5:
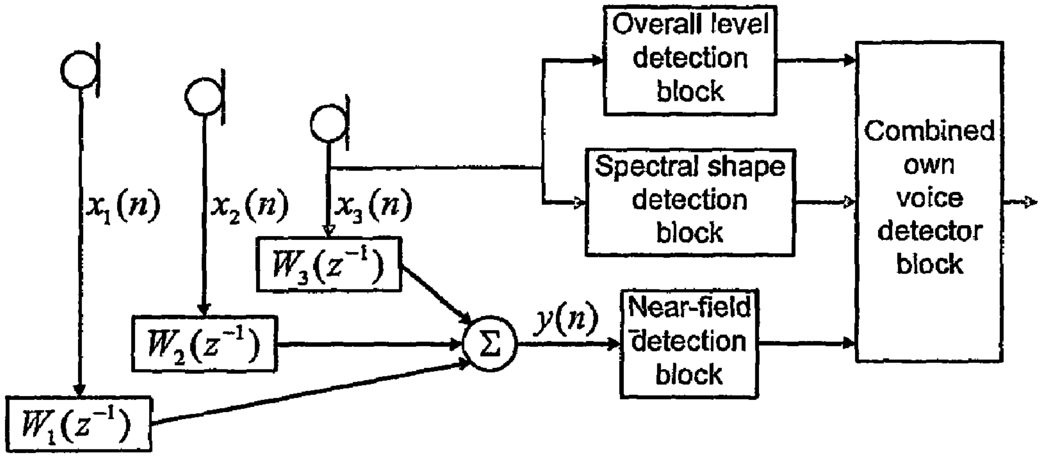
FIG. 5 is a schematic representation of a preferred embodiment of an own voice detection device according to the invention.

FIG. 5 shows an own voice detection device, which uses a combination of individual own voice detectors. The first individual detector is the near-field detector as described above, and as sketched in FIG. 1 and FIG. 2. The second individual detector is based on the spectral shape of the input signal $x_3(n)$ and the third individual detector is based on the overall level of the input signal $x_3(n)$. In this example the combined own voice detector is thought to flag activity of own voice when all three individual detectors flag own voice activity. Other combinations of individual own voice detectors, based on the above described examples, are obviously possible. Similarly, more advanced ways of combining the outputs from the individual own voice detectors into the combined detector, e.g. based on probabilistic functions, are obvious.

The invention claimed is:

1. Method for detection of own voice activity in a communication device, the method comprising: providing at least a microphone at each ear of a person and receiving sound signals from the microphones and routing the microphone signals to a signal processing unit wherein the following processing of the signals takes place: characteristics of a signal, which are due to the fact that the user's mouth is placed symmetrically with respect to the user's head are determined, and based on these determined characteristics it is assessed whether the sound signals originate from the users own voice or originate from another source.

2. The Method of claim 1, whereby the overall signal level in the microphone signals is determined in the signal processing unit, and this characteristic is used in the assessment of whether the signal is from the users own voice.

3. The Method of claim 1, whereby the characteristics, which are due to the fact that the user's mouth is placed symmetrically with respect to the user's head are determined by receiving the signals $x_1(n)$ and $x_2(n)$, from microphones positioned at each ear of the user, and compute the cross-correlation function between the two signals: $R_{x_1x_2}(k)=E\{x_1(n)x_2(n-k)\}$, applying a detection criterion to the output $R_{x_1x_2}(k)$, such that if the maximum value of $R_{x_1x_2}(k)$ is found at k=0 the dominating sound source is in the median plane of the user's head whereas if the maximum value of $R_{x_1x_2}(k)$ is found elsewhere the dominating sound source is away from the median plane of the user's head.

4. A Method for detection of own voice activity in a communication device, the method comprising:

providing at least two microphones at an ear of a person;

receiving sound signals from the microphones;

routing the signals to a signal processing unit; and processing of the routed signals, wherein processing comprises determining characteristics of a signal based on the fact that the microphones are in the acoustical near-field of the speaker's mouth and in the far-field of the other sources of sound, and assessing, based on these determined characteristics, whether the sound signals originate from the users own voice or originate from another source;

whereby the characteristics, which are due to the fact that the microphones are in the acoustical near-field of the speaker's mouth are determined by a filtering process comprising FIR filters, filter coefficients of which are determined so as to maximize the difference in sensitivity towards sound coming from the mouth as opposed to sound coming from all directions by using a Mouth-to-Random-far-field index (abbreviated M2R) whereby the M2R obtained using only one microphone at an ear is compared with the M2R using more than one microphone at said ear in order to take into account the different source strengths pertaining to the different acoustic sources; and wherein M2R is determined by the expression:

$$M2R(f) = 10\log_{10}\left(\frac{|Y_{Mo}(f)|^2}{|Y_{Rff}(f)|^2}\right),$$

where $Y_{Mo}(f)$ is the spectrum of the output signal y(n) due to the mouth alone, $Y_{Rff}(f)$ is the spectrum of the output signal y(n) averaged across a representative set of far-field sources and f denotes frequency.

5. An apparatus for detection of own voice activity in a communication device comprising:

at least three microphones, wherein at least two of said microphones are configured to be disposed at an ear of a person and further wherein at least one of said microphones is configured to be disposed at the other ear of said person;

a microphone input routing device that routs sound signals received by said microphones to a signal processing unit; and a signal processing unit that processes the routed sound signals, wherein the signal processing unit comprises:

an acoustical near-field determination unit that determines first characteristics based on the routed sound signals related to the location of said at least two microphones in the acoustical near-field of said person's mouth and in the acoustical far-field of other sources of sound;

a mouth position symmetry analysis unit that determines second characteristics based on the routed sound signals related to the fact that said person's mouth is located symmetrically with respect to said person's head; and a characteristics assessment unit that assesses, based on said first and second characteristics, whether said sound signals originate from said person's own voice or from another source.

6. The apparatus of claim 5 whereby the acoustical near-field determination unit determines characteristics by a filtering process comprising FIR filters, filter coefficients of which are determined so as to maximize the difference in sensitivity towards sound coming from the mouth as opposed to sound coming from all directions by using a Mouth-to-Random-far-field index (abbreviated M2R) whereby the M2R obtained using only one microphone at an ear is compared with the M2R using more than one microphone at said ear in order to take into account the different source strengths pertaining to the different acoustic sources.

7. The apparatus of claim 5 wherein the acoustical near-field determination unit employs an M2R is determined by the expression:

$$M2R(f) = 10\log_{10}\left(\frac{|Y_{Mo}(f)|^2}{|Y_{Rff}(f)|^2}\right),$$

where $Y_{Mo}(f)$ is the spectrum of the output signal y(n) due to the mouth alone, $Y_{Rff}(f)$ is the spectrum of the output signal y(n) averaged across a representative set of far-field sources and f denotes frequency.

8. An apparatus for detection of own voice activity in a communication device comprising:

at least two microphones, wherein one of said at least two microphones is configured to be disposed at an ear of a person and another of said at least two microphones is configured to be disposed at the other ear of a person;

a microphone input routing device that routs sound signals received by said microphones to a signal processing unit; and a signal processing unit that processes the routed sound signals, wherein the signal processing unit comprises:

a mouth position symmetry analysis unit that determines characteristics based on the routed sound signals related to the fact that said person's mouth is located symmetrically with respect to said person's head; and a characteristics assessment unit that assesses, based on said characteristics, whether said sound signals originate from said person's own voice or from another source.

9. The apparatus of claim 8, whereby the mouth position symmetry analysis unit determines characteristics by receiving the signals $x_1(n)$ and $x_2(n)$, from the microphones positioned at each ear of the user, and computing the cross-correlation function between the two signals: $R_{x_1x_2}(k)=E\{x_1(n)x_2(n-k)\}$, applying a detection criterion to the output $R_{x_1x_2}(k)$, such that if the maximum value of $R_{x_1x_2}(k)$ is found at k=0 the dominating sound source is in the median plane of the user's head whereas if the maximum value of $R_{x_1x_2}(k)$ is found elsewhere the dominating sound source is away from the median plane of the user's head.

10. The apparatus of claim 8, whereby the overall signal level in the microphone signals is determined in the signal processing unit, and this characteristic is used in the assessment of whether the signal is from the users own voice.

11. An apparatus for detection of own voice activity in a communication device comprising:

at least two microphones, wherein at least two of said microphones are configured to be disposed at an ear of a person;

a microphone input routing device that routs sound signals received by said microphones to a signal processing unit; and a signal processing unit that processes the routed sound signals, wherein the signal processing unit comprises:

an acoustical near-field determination unit that determines characteristics based on the routed sound signals related to the location of said microphones in the acoustical near-field of said person's mouth and in the acoustical far-field of other sources of sound;

a characteristics assessment unit that assesses, based on said characteristics, whether said sound signals originate from said person's own voice or from another source;

whereby the acoustical near-field determination unit determines characteristics by a filtering process comprising FIR filters, filter coefficients of which are determined so as to maximize the difference in sensitivity towards sound coming from the mouth as opposed to sound coming from all directions by using a Mouth-to-Random-far-field index (abbreviated M2R) whereby the M2R obtained using only one microphone at an ear is compared with the M2R using more than one microphone at said ear in order to take into account the different source strengths pertaining to the different acoustic sources; and wherein the acoustical near-field determination unit employs an M2R is determined by the expression:

$$M2R(f) = 10\log_{10}\left(\frac{|Y_{Mo}(f)|^2}{|Y_{Rff}(f)|^2}\right),$$

where $Y_{Mo}(f)$ is the spectrum of the output signal y(n) due to the mouth alone, $Y_{Rff}(f)$ is the spectrum of the output signal y(n) averaged across a representative set of far-field sources and f denotes frequency.

12. The apparatus of claim 11, whereby the overall signal level in the microphone signals is determined in the signal processing unit, and this characteristic is used in the assessment of whether the signal is from the users own voice.

13. Method for detection of own voice activity in a communication device whereby both of the following sets of actions are performed, A: providing at least two microphones at an ear of a person, receiving sound signals from the microphones and routing the signals to a signal processing unit wherein the following processing of the signal takes place: characteristics of a signal, which are due to the fact that the microphones are in the acoustical near-field of the speaker's mouth and in the far-field of the other sources of sound are determined, and based on these determined characteristics it is assessed whether the sound signals originate from the users own voice or originate from another source, B: providing at least a microphone at each ear of a person and receiving sound signals from the microphones and routing the microphone signals to a signal processing unit wherein the following processing of the signals takes place: characteristics of a signal, which are due to the fact that the user's mouth is placed symmetrically with respect to the user's head are determined, and based on these determined characteristics it is assessed whether the sound signals originate from the users own voice or originate from another source.

14. The Method of claim 13 whereby the characteristics, which are due to the fact that the microphones are in the acoustical near-field of the speaker's mouth are determined by a filtering process comprising FIR filters, filter coefficients of which are determined so as to maximize the difference in sensitivity towards sound coming from the mouth as opposed to sound coming from all directions by using a Mouth-to-Random-far-field index (abbreviated M2R) whereby the M2R obtained using only one microphone at an ear is compared with the M2R using more than one microphone at said ear in order to take into account the different source strengths pertaining to the different acoustic sources.

15. The method of claim 14, wherein M2R is determined by the expression:

$$M2R(f) = 10\log_{10}\left(\frac{|Y_{Mo}(f)|^2}{|Y_{Rff}(f)|^2}\right),$$

where $Y_{Mo}(f)$ is the spectrum of the output signal y(n) due to the mouth alone, $Y_{Rff}(f)$ is the spectrum of the output signal y(n) averaged across a representative set of far-field sources and f denotes frequency.

* * * * *